United States Patent
Miyazaki

[11] Patent Number: 5,250,857
[45] Date of Patent: Oct. 5, 1993

[54] DYNAMIC LOGIC CIRCUIT WITH REDUCED OPERATING CURRENT

[75] Inventor: Takashi Miyazaki, Tokyo, Japan
[73] Assignee: NEC Corporation, Tokyo, Japan
[21] Appl. No.: 825,682
[22] Filed: Jan. 27, 1992

[30] Foreign Application Priority Data

Jan. 25, 1991 [JP] Japan ............... 3-007562

[51] Int. Cl.⁵ .................... H03K 19/20; G11C 7/00
[52] U.S. Cl. .................... 307/449; 307/463; 365/203; 365/204; 365/239
[58] Field of Search ............... 307/452, 480, 449, 463; 365/203, 204, 221, 239

[56] References Cited

U.S. PATENT DOCUMENTS

| | | | |
|---|---|---|---|
| 4,660,171 | 4/1987 | Modre et al. | 307/463 |
| 4,661,724 | 4/1987 | Remington et al. | 307/463 |
| 4,817,054 | 3/1989 | Banersee et al. | 365/239 |
| 4,896,300 | 1/1990 | Shinagawa et al. | 365/204 |
| 4,910,466 | 3/1990 | Kiuchi et al. | 307/463 |
| 5,059,828 | 10/1991 | Tanagawa | 307/449 |
| 5,062,082 | 10/1991 | Choi | 307/449 |
| 5,155,705 | 10/1992 | Goto et al. | 365/239 |

*Primary Examiner*—Edward P. Westin
*Assistant Examiner*—Andrew Sanders
*Attorney, Agent, or Firm*—Whitham & Marhoefer

[57] ABSTRACT

In a dynamic logic circuit, an X decoder and a Y decoder receive a more significant bit portion and a less significant bit portion of an internal address generated by a sequencer, respectively. A precharge signal supplied to the X decoder is generated when the sequencer start signal is applied to the sequencer, or when the more significant bit portion of the address supplied to the X decoder changes or is incremented. Therefore, even when the less significant bit portion of the address supplied to the Y decoder changes or is incremented, the precharge signal supplied to the X decoder is not generated if the more significant bit portion of the address supplied to the X decoder does not change. Thus, the number of the precharge/discharge is reduced, and accordingly, the operating current of the dynamic logic circuit is decreased.

10 Claims, 4 Drawing Sheets

DYNAMIC LOGIC CIRCUIT WITH REDUCED OPERATING CURRENT

BACKGROUND OF THE INVENTION

1. Field of the Invention

The present invention relates to a dynamic logic circuit composed of an array of MOSFETs (metal-oxide-semiconductor field effect transistor).

2. Description of Related Art

A dynamic logic circuit is one of important LSI design methods for constituting a programmable logic circuit having a high integration density, and has been used in designing a micro ROM (read only memory).

Conventional dynamic logic circuits have been disadvantageous in that, when continuous addresses are supplied, an output of an X-decoder does not change, but internal decoded lines are repeatedly precharged and discharged, so that an operating current of the dynamic logic circuit becomes large due to the current generated by the repeated precharges and discharges.

SUMMARY OF THE INVENTION

Accordingly, it is an object of the present invention to provide a dynamic logic circuit which has overcome the above mentioned defect of the conventional one.

Another object of the present invention is to provide a dynamic logic circuit having a reduced operating current when continuous addresses are supplied.

The above and other objects of the present invention are achieved in accordance with the present invention by a dynamic logic circuit comprising a sequencer receiving an input address for sequentially generating an internal address on the basis of the input address in response to a predetermined timing signal, the sequencer generating a continuous address in response to each of clock signals supplied after the predetermined timing signal, a first decoder receiving and decoding a more significant bit portion of the internal address and having internal decoded lines precharged in response to each of the clock signals so as to activate selectively the decoded lines on the basis of the result of the decoding of the more significant bit portion of the internal address, a hold circuit receiving and holding the selectively activated status of the decoded lines, a code circuit coupled to the hold circuit for generating a plurality of logics corresponding to the selectively activated status of the decoded lines held in the hold circuit, a second decoder receiving and decoding a less significant bit portion of the internal address for selectively activate their plurality of decoded lines, a selector receiving the plurality of logics and controlled by the decoded lines of the second decoder so as to output one of the plurality of logics selected in accordance with the result of decoding of the second decoder, and means receiving a selected portion of the plurality of decoded lines of the second decoder for controlling the first decoder so that the prechange of the internal decoded lines of the first decoder is inhibited when the selected portion of the plurality of decoded lines of the second decoder fulfils a predetermined condition.

The above and other objects, features and advantages of the present invention will be apparent from the following description of preferred embodiments of the invention with reference to the accompanying drawings.

DESCRIPTION OF THE PREFERRED EMBODIMENTS

Figure 1:
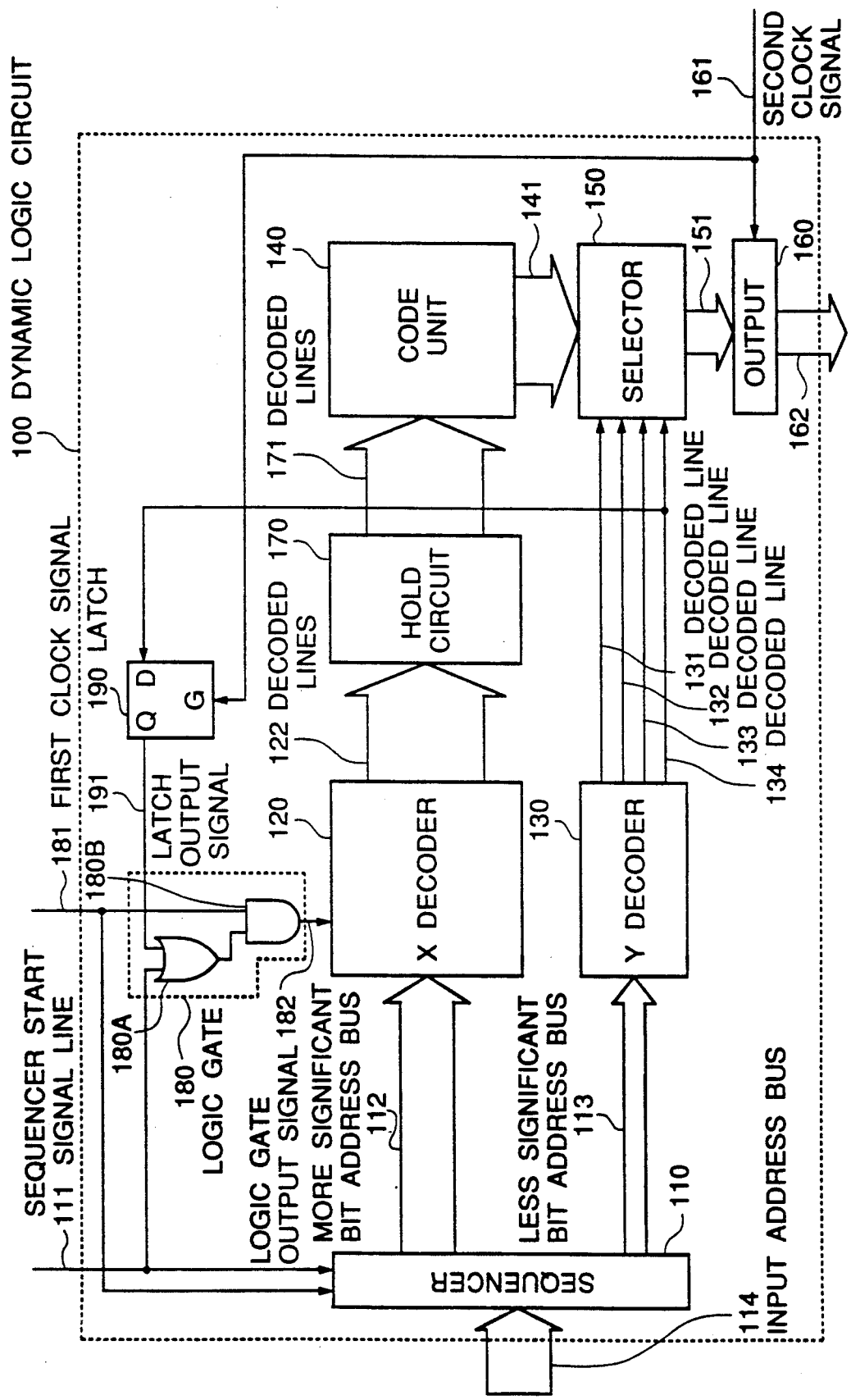
FIG. 1 is a block diagram of an embodiment of the dynamic logic circuit in accordance with the present invention.

Referring to FIG. 1, there is shown a block diagram of an embodiment of the dynamic logic circuit in accordance with the present invention.

The shown dynamic logic circuit is generally indicated by Reference Numeral 100, and includes a sequencer 110 for generating an internal address for dynamic logic circuit, an X decoder 120 for decoding more significant bits of the generated internal address, a Y decoder 130 for decoding less significant bits of the generated internal address, a hold circuit 170 for holding an output of the X decoder 120, a code unit 140 for determining logics of output data corresponding to the internal address, a selector 150 for selecting one from the outputs of the code unit 140 on the basis of the less significant bits of the generated internal address, an output circuit 160 for holding an output of the selector 150 at a predetermined timing, a latch circuit 190, and a logic gate 180 composed of an OR gate 180A and an AND gate 180B having one input connected to an output of the OR gate 180A.

The X decoder 120 is coupled through a more significant bit address bus 112 to the sequencer 110, and the Y decoder 130 is coupled through a less significant bit address bus 113 to the sequencer 110. The hold circuit 170 is coupled through a group of decoded lines 122 to the X decoder 120, and the code unit 140 is coupled through a group of decoded lines 171 to the hold circuit 170. The selector 150 is coupled to the Y decoder 130 through decoded lines 131 to 134, and also coupled to the code unit 140 through a code unit output bus 141. The output circuit 160 is coupled through a selector output bus 151 to the selector 150. A D input of the latch circuit 190 is connected through the decoded line 131 to the Y decoder 130, and a Q output of the latch 190 is connected through a latch output signal line 191 to the logic gate 180, more specifically to one input of the OR gate 182. An output of the logic gate 180, namely, an output of the AND gate 180B is connected through a logic gate output signal line 182 to the X decoder 120. The sequencer 110 receives the input address through an input address bus 114, and also receives a sequencer starting signal through a sequencer starting signal line 111. This sequencer starting signal line 111 is also connected to the logic gate 180, more specifically, to another input of the OR gate 180A. A first clock line 181 is connected to the sequencer 110 and the logic gate 180, more specifically, another input of the AND gate 180B. A second clock line 161 is connected to the latch circuit 190 and the output circuit 160. An output of the output circuit 160 is coupled to an output bus 162.

Figure 2:
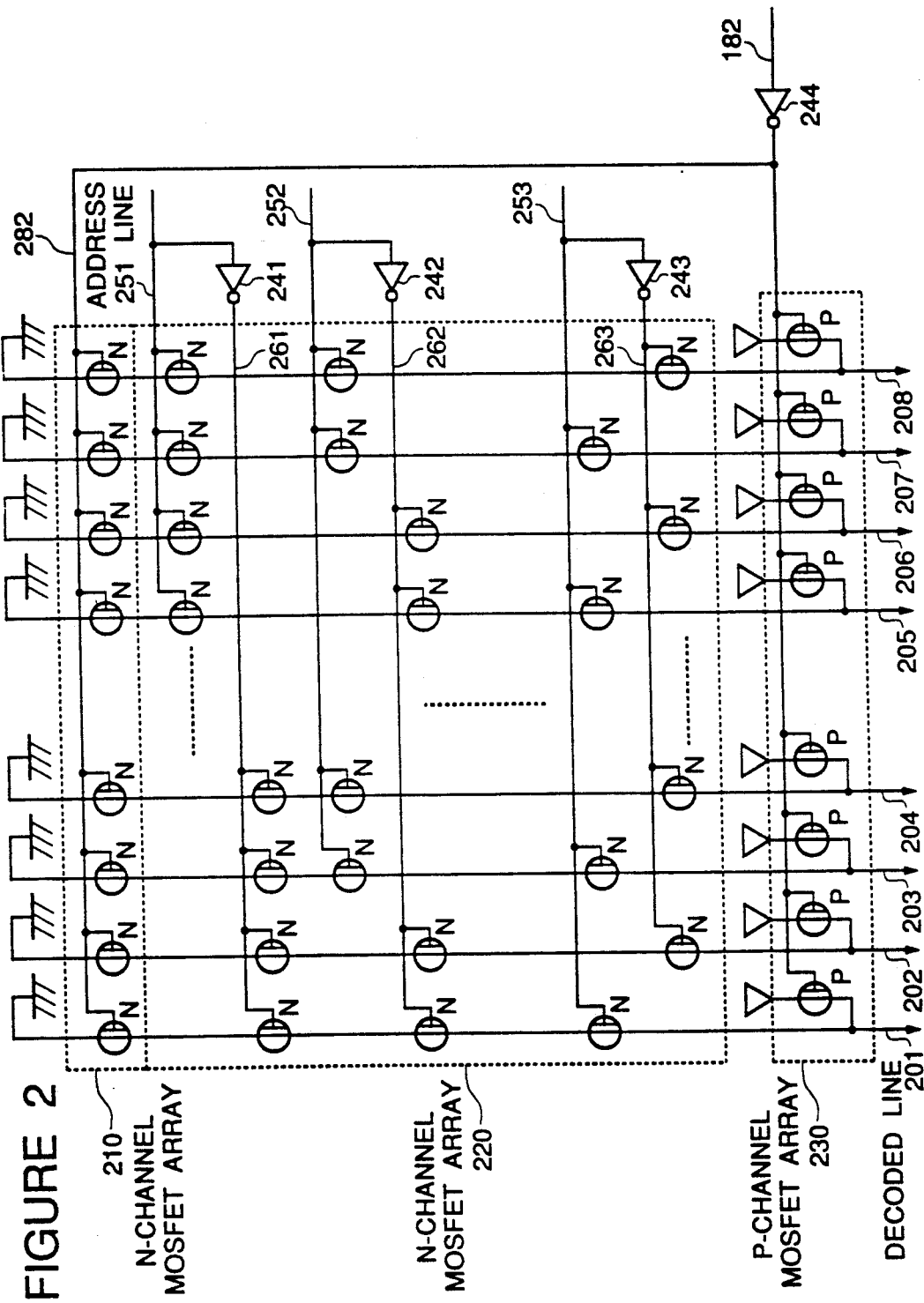
FIG. 2 is a circuit diagram of an X-decoder used in the dynamic logic circuit shown in FIG. 1.

The X decoder 120 includes an array 230 of P-channel MOSFETs arrays 210 and 220 of N-channel MOS- FETs, and inverters 241 to 244, connected as shown in FIG. 2. The P-channel MOSFET array 230 includes P-channel MOSFETs of the same number as that of decoded lines 201 to 208 which constitute the decoded line group 122 of the X decoder 120, and the N-channel MOSFET array 210 includes N-channel MOSFETs of the same number as that of the decoded lines 201 to 208. Each of the P-channel MOSFETs of the P-channel MOSFET array 230 is connected to a corresponding one of the decoded lines 201 to 208 and is pulled up to a high voltage for precharging the corresponding one of the decoded lines 201 to 208. In addition, each of the N-channel MOSFETs of the N-channel MOSFET array 210 is connected to a corresponding one of the decoded lines 201 to 208 and is pulled down to the ground for discharging or clearing the corresponding one of the decoded lines 201 to 208. In addition, the P-channel MOSFETs of the P-channel MOSFET array 230 and the N-channel MOSFETs of the N-channel MOSFET array 210 are connected at their gate in common to an output of the inverter 244 receiving at its input the logic gate output signal 182, so that when the logic gate output signal 182 is active or at a high level, all the decoded lines 201 to 208 are precharged, and when the logic gate output signal 182 is inactive or at a low level, all the decoded lines 201 to 208 are discharged under control of the N-channel MOSFET array 220.

The N-channel MOSFETs of the N-channel MOSFET array 220 are connected in a given decoding pattern between the P-channel MOSFET array 230 and the N-channel MOSFET array 210 so that each MOSFET is inserted in a selected one of the decoded lines 201 to 208. As shown in FIG. 2, each of the N-channel MOSFETs of the N-channel MOSFET array 220 has its gate connected to a predetermined one of address lines 251 to 253 of the more significant bit address bus 112 or to a predetermined one of inverted address lines 261 to 263 which are connected through the inverters 241 to 243 to the address lines 251 to 253, respectively.

Here, operation of the dynamic logic circuit will be described, assuming that the input address is composed of "n" bits, and two bits of the "n" bits are supplied to the Y decoder 130.

Figure 3:
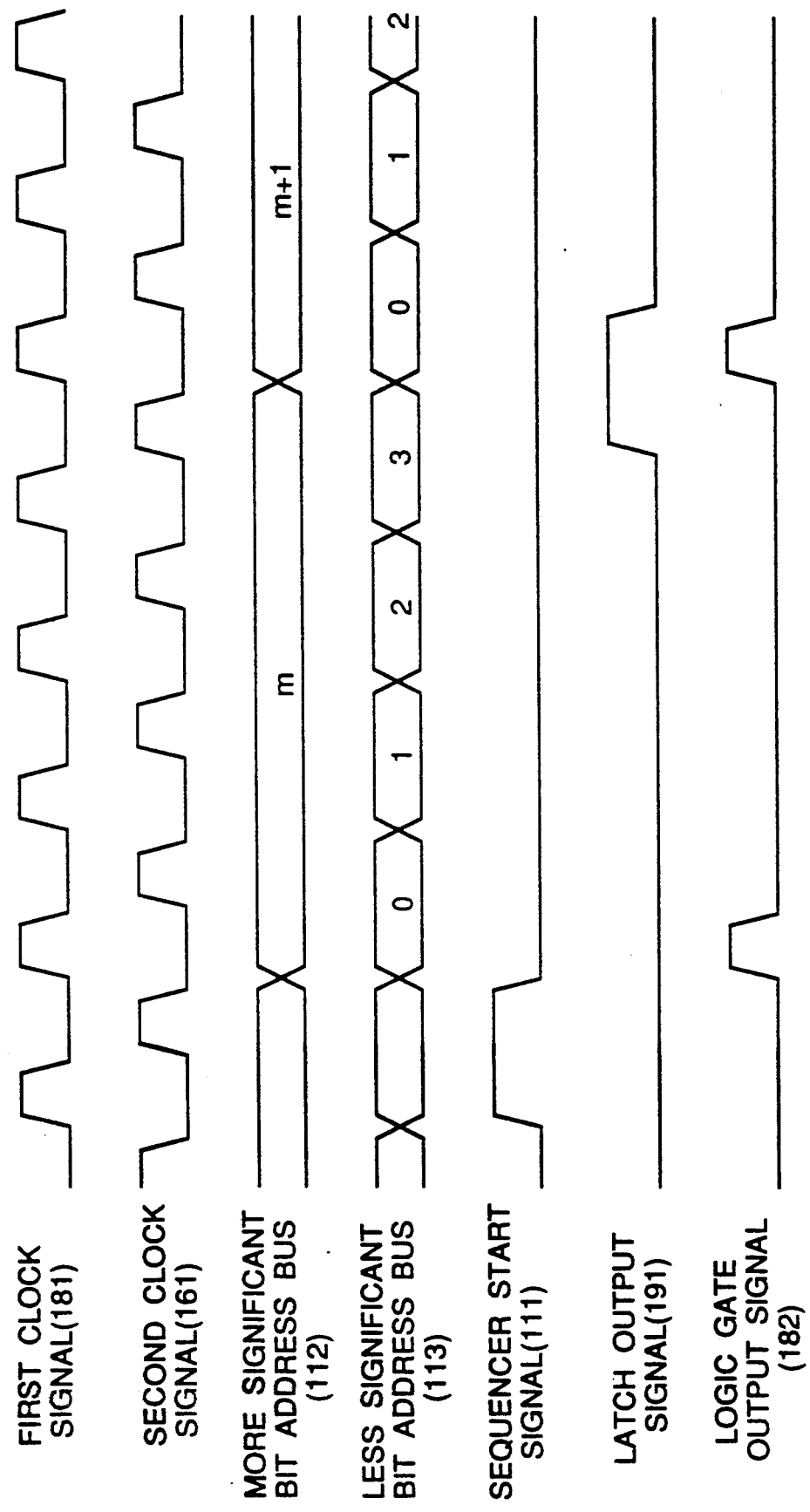
FIG. 3 is a timing chart illustrating an operation of the dynamic logic circuit shown in FIG. 1.

When the sequencer start signal 111 is activated, the sequencer 110 generates an internal address of "n" bits on the basis of the address supplied through the input address bus 114, and thereafter, sequentially generates a continuous internal address for each one clock 181 as shown in FIG. 3. The internal address generated by the sequencer 110 is divided into the more significant bits of (n−2) bits and the less significant bits of 2 bits, the former being supplied to the X decoder 120 and the latter being supplied to the Y decoder 130. The X decoder 120 decodes the (n−2) more signifiant bits of the internal address generated by the sequencer 110 so as to selectively activate the decoded lines 122. The selectively activated pattern of the decoded lines 122 outputted from the X decoder 120 is held in the hold circuit 170, so that the held activation pattern is supplied to the code unit 140 by selectively activating the decoded lines 171 in accordance with the held activation pattern.

On the other hand, the Y decoder 130 decodes the two less significant bits of the internal address generated by the sequencer 110. When the two less significant bits of the internal address indicates "0", the Y decoder 130 selectively activates the decoded line 134, and when the two less significant bits of the internal address indicates "1", the Y decoder 130 selectively activates the decoded line 133. In addition, when the two less significant bits of the internal address indicates "2", the Y decoder 130 selectively activates the decoded line 132, and when the two less significant bits of the internal address indicates "3", the Y decoder 130 selectively activates the decoded line 131. The code unit 140 outputs a plurality of logics or data corresponding to the activated line pattern of the decoded lines 171, through the bus 141 to the selector 150. On the basis of one of the decoded lines 131 to 134 selectively activated by the Y decoder 130, the selector 150 selects one from the plurality of logics or data on the code unit output bus 141, so that the selected logic or data is supplied through the selector output bus 151 to the output circuit 160. The output circuit holds the data on the selector output bus 151 at the timing of a second clock on the second clock line 161, and the output data held in the output circuit 160 is supplied through the output bus 162.

Next, operation of the X decoder will be described.

When the first clock signal line 181 is at a high level, and when the sequencer start signal line 111 or the latch output signal line 191 of the latch 190 which has latched the decoded line 131 in synchronism with the second clock on the second clock signal line 161 is active, the logic gate output signal 182 outputted from the logic gate 180 is activated to a high level as shown in FIG. 3, and therefore, the decoded lines 201 to 208 are precharged. Accordingly, when the sequencer 110 is triggered, or when the two less significant bits of the address generated by the sequencer 110 are incremented from "3" to "0" as shown in FIG. 3, the decoded lines 201 to 208 are precharged. In other words, when the two less significant bits of the address generated by the sequencer 110 are incremented from "0" to "1", from "1" to "2", or from "2" to "3", the decoded lines 122 are not precharged, and the hold circuit 170 continues to outputs the held data to the code unit 140.

When the first clock line 181 is at a low level, a logic between the decoded lines 201 to 208 and the address lines 251 to 253 and 261 to 263 is determined by N-channel MOSFETs in the N-channel MOSFET array 220 at intersections between the decoded lines 201 to 208 and the address lines 251 to 253 and 261 to 263.

Thus, in the above mentioned dynamic logic circuit, when continuous addresses are supplied, the decoded lines of the X decoder are precharged only when the address portion inputted to the X decoder changes, and the address portion inputted to the X decoder is decoded only when the address portion inputted to the X decoder changes. In other words, the decoded lines of the X decoder are not precharged every time when the internal address outputted from the sequencer is incremented. Therefore, the precharge performed in the X decoder is limited to only predetermined reduced timings, so that the number of precharge/discharge is suppressed or reduced. As a result, the operating current of the dynamic logic circuit can be decreased.

Figure 4:
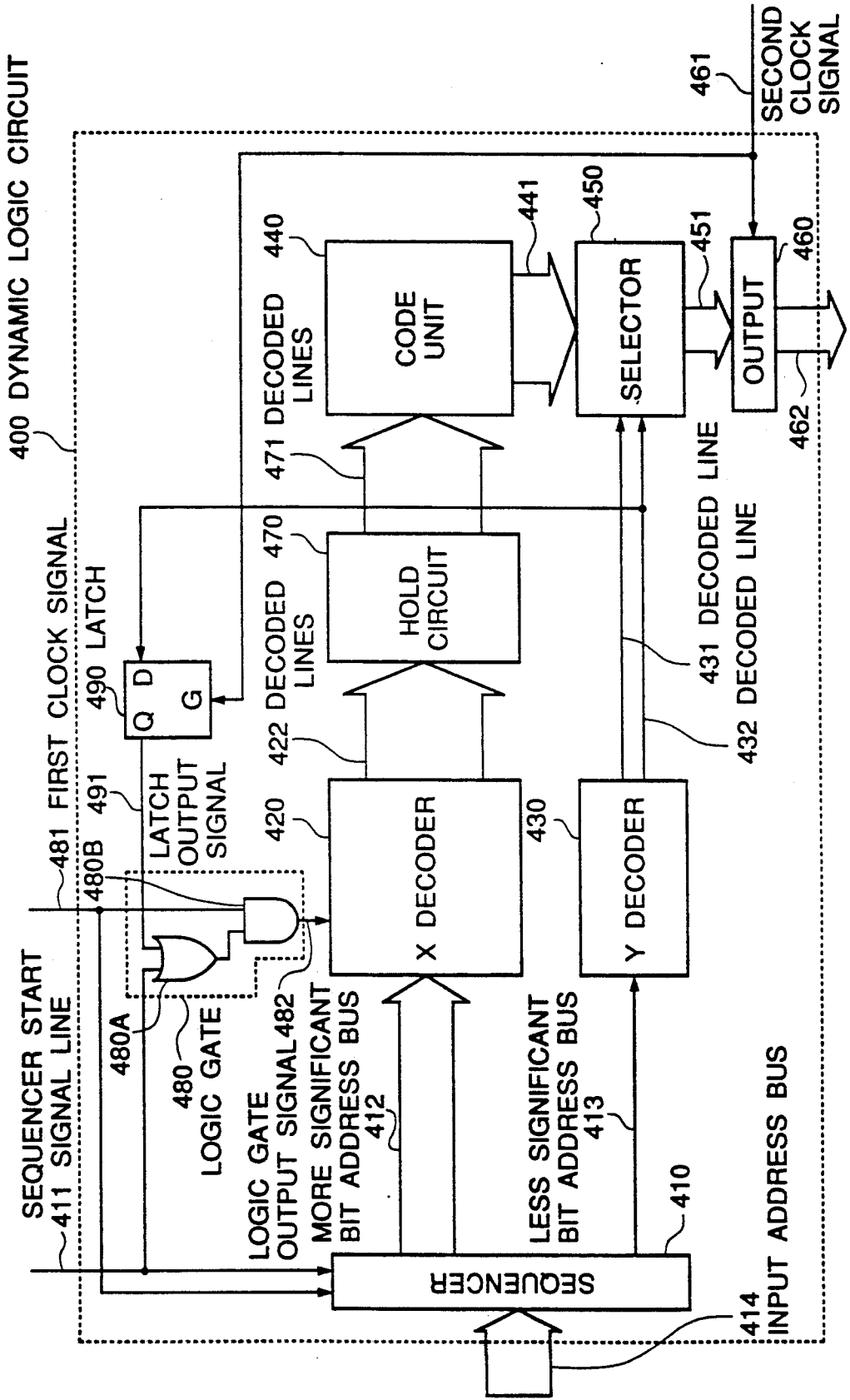
FIG. 4 is a block diagram of another embodiment of the dynamic logic circuit in accordance with the present invention.

Referring to FIG. 4, there is shown a block diagram of another embodiment of the dynamic logic circuit in accordance with the present invention.

The shown dynamic logic circuit is generally indicated by Reference Numeral 400, and includes a sequencer 410 for generating an internal address for the dynamic logic circuit, an X decoder 420 for decoding more significant bits of the generated internal address, a Y decoder 430 for decoding a least significant bit of the generated internal address, a hold circuit 470 for holding an output of the X decoder 420, a code unit 440 for determining logics of output data corresponding to the internal address, a selector 450 for selecting one from the outputs of the code unit 440 on the basis of the least significant bit of the generated internal address, an output unit 460 for holding an output of the selector 450 at a predetermined timing, a latch circuit 490, and a logic gate 480 composed of an OR gate 480A and an AND gate 480B having one input connected to an output of the OR gate 480A.

The X decoder 420 is coupled through a more significant bit address bus 412 to the sequencer 410, and the Y decoder 430 is coupled through a least significant bit address line 413 to the sequencer 410. The hold circuit 470 is coupled through a group of decoded lines 422 to the X decoder 420, and the code unit 440 is coupled through a group of decoded lines 471 to the hold circuit 470. The selector 450 is coupled to the Y decoder 430 through decoded lines 431 and 432, and also coupled to the code unit 440 through a code unit output bus 441. The output circuit 460 is coupled through a selector output bus 451 to the selector 450. A D input of the latch circuit 490 is connected through the decoded line 431 to the Y decoder 430, and a Q output of the latch 490 is connected through a latch output signal line 491 to the logic gate 480, more specifically to one input of the OR gate 482. An output of the logic gate 480, namely, an output of the AND gate 480B is connected through a logic gate output signal line 482 to the X decoder 420. The sequencer 410 receives the input address through an input address bus 414, and also receives a sequencer starting signal through a sequencer starting signal line 411. This sequencer starting signal line 411 is also connected to the logic gate 480, more specifically, to another input of the OR gate 480A. A first clock line 481 is connected to the sequencer 410 and the logic gate 480, more specifically, another input of the AND gate 480B. A second clock line 461 is connected to the latch circuit 490 and the output circuit 460. An output of the output circuit 460 is coupled to an output bus 462.

When the first clock signal line 481 is at a high level, and when the sequencer start signal line 411 or the latch output signal line 491 of the latch 490 which has latched the decoded line 431 in synchronism with the second clock on the second clock signal line 461 is active, the decoded lines 422 are precharged in accordance with the logic gate output signal 482 of the logic gate 480. Accordingly, when the sequencer 410 is triggered, or when the least significant bit of the address generated by the sequencer 410 is incremented from "1" to "0", the decoded lines 422 are precharged. In other words, when the least significant bit of the address generated by the sequencer 410 is incremented from "0" to "1", the decoded lines 422 are not precharged, and the hold circuit 170 continues to outputs the held data to the code unit 440.

Thus, in the above mentioned second embodiment of the dynamic logic circuit, when continuous addresses are supplied, the decoded lines of the X decoder are precharged only when the address portion inputted to the X decoder changes, and the address portion inputted to the X decoder is decoded only when the address portion inputted to the X decoder changes. In other words, the decoded lines of the X decoder are not precharged every time when the internal address outputted from the sequencer is incremented. Therefore, the precharge performed in the X decoder is limited to only predetermined reduced timings, so that the number of precharge/discharge is suppressed or reduced. As a result, the operating current of the dynamic logic circuit can be decreased.

The invention has thus been shown and described with reference to the specific embodiments. However, it should be noted that the present invention is in no way limited to the details of the illustrated structures but changes and modifications may be made within the scope of the appended claims.

I claim:

1. A dynamic logic circuit comprising a sequencer receiving an input address for generating an internal address on the basis of said input address in response to a predetermined timing signal, said sequencer sequentially generating a continuous address in response to each of first clock signals supplied after said predetermined timing signal, a first decoder receiving and decoding only a more significant bit portion of said internal address and having internal decoded lines precharged in response to each of said first clock signals so as to activate selectively said internal decoded lines on the basis of the result of the decoding of said more significant bit portion of said internal address, a hold circuit receiving and holding said selectively activated status of said internal decoded lines, a code circuit coupled to said hold circuit for generating a plurality of logics corresponding to said selectively activated status of said internal decoded lines held in said hold circuit, a second decoder receiving and decoding only a less significant bit portion of said internal address for selectively activating a plurality of decoded lines thereof, a selector receiving said plurality of logics and controlled by said plurality of decoded lines of said second decoder so as to output one of said plurality of logics selected in accordance with the result of decoding of said second decoder, and precharge inhibit means receiving a selected portion of said plurality of decoded lines of said second decoder for controlling said first decoder so that the precharge of said internal decoded lines of said first decoder is inhibited when said selected portion of said plurality of decoded lines of said second decoder fulfills a predetermined condition.

2. A dynamic logic circuit claimed in claim 1 further including a latch circuit connected to a predetermined one of said plurality of decoded lines of said second decoder so as to latch a logic level of said predetermined one of said plurality of decoded lines of said second decoder in response to a second clock signal which is activated at a time during an inactive period of said first clock signal, and wherein said precharge inhibit means includes a logic gate circuit receiving said first clock signal, said predetermined timing signal, and an output of said latch circuit, and for supplying a precharge signal to said first decoder in synchronism with said first clock signal only when said predetermined timing signal is activated or when said predetermined one of said plurality of decoded lines of said second decoder assumes a predetermined logical level.

3. A dynamic logic circuit claimed in claim 2 wherein said second decoder receives and decodes only a least significant bit of said internal address and has a first decoded line activated when said least significant bit of said internal address becomes "1" and a second decoded line activated when said least significant bit of said internal address becomes "0", and said latch circuit is connected to said second decoded line of said second decoder, so that said logic gate circuit supplies said precharge signal to said first decoder in synchronism with said first clock signal when said least significant bit of said internal address becomes "0" from "1".

4. A dynamic logic circuit claimed in claim 2 wherein said second decoder receives and decodes a plurality of less significant bits of said internal address and has decoded lines of the number corresponding to the number of different numerical values which can be expressed by said plurality of less significant bits, and said latch circuit is connected to a predetermined one of said decoded lines of said second decoder activated when the numerical value expressed by said plurality of less significant bits becomes "0", so that said logic gate circuit supplies said precharge signal to said first decoder in synchronism with said first clock signal when the numerical value expressed by said plurality of less significant bits becomes "0".

5. A dynamic logic circuit claimed in claim 4 wherein said second decoder receives and decodes two less significant bits of said internal address and has four decoded lines respectively corresponding to different numerical values "0", "1", "2" and "3" which can be expressed by said two less significant bits, and said latch circuit is connected to a predetermined one of said decoded lines corresponding to the numerical value "0", so that said logic gate circuit supplies said precharge signal to said first decoder in synchronism with said first clock signal when the numerical values expressed by said two less significant bits becomes "0" from "3".

6. A dynamic logic circuit comprising a sequencer receiving an input address for generating an internal address on the basis of said input address in response to a predetermined timing signal, said sequencer sequentially generating a continuous address in response to each of first clock signals supplied after said predetermined timing signal, an X decoder receiving and decoding only a more significant bit portion of said internal address and having internal decoded lines precharged in response to a precharge signal so as to activate selectively said internal decoded lines on the basis of the result of the decoding of said more significant bit portion of said internal address, a hold circuit receiving and holding said selectively activated status of said internal decoded lines, a code circuit coupled to said hold circuit for generating a plurality of data corresponding to said selectively activated status of said internal decoded lines held in said hold circuit, a Y decoder receiving and decoding only a less significant bit portion of said internal address for selectively activating a plurality of decoded lines thereof, a selector receiving said plurality of data and controlled by said Y decoder so as to output one of said plurality of data selected in accordance with the result of decoding of said Y decoder, and precharge control means receiving said first clock signal, said predetermined timing signal and a portion of said plurality of decoded lines of said Y decoder for generating and supplying said precharge signal to said X decoder in synchronism with said first clock signal only when said predetermined timing signal is activated or when said predetermined portion of said plurality of said plurality of decoded lines of said Y decoder assumes a predetermined logical level.

7. A dynamic logic circuit claimed in claim 6 further including a latch circuit connected to a predetermined one of said plurality of decoded lines of said Y decoder so as to latch a logic level of said predetermined one of said plurality of decoded lines of said Y decoder in response to a second clock signal which is activated at a time during an inactive period of said first clock signal, and wherein said precharge control means includes a logic gate circuit receiving said first clock signal, said predetermined timing signal, and an output of said latch circuit, and for supplying said precharge signal to said X decoder in synchronism with said first clock signal only when said predetermined timing signal is activated or when said predetermined one of said plurality of decoded lines of said Y decoder assumes a predetermined logical level.

8. A dynamic logic circuit claimed in claim 7 wherein said Y decoder receives and decodes only a least significant bit of said internal address and has a first decoded line activated when said least significant bit of said internal address becomes "1" and a second decoded line activated when said least signicicant bit of said internal address becomes "0", and said latch circuit is connected to said second decoded line of said Y decoder, so that said logic gate circuit supplies said precharge signal to said X decoder in synchronism with said first clock signal when said least significant bit of said internal address becomes "0" from "1".

9. A dynamic logic circuit claimed in claim 7 wherein said Y decoder receives and decodes a plurality of less significant bits of said internal address and has decoded lines of the number corresponding to the number of different numerical values which can be expressed by said plurality of less significant bits, and said latch circuit is connected to a predetermined one of said decoded lines of said Y decoder activated when the numerical values expressed by said plurality of less significant bits becomes "0", so that said logic gate circuit supplies said precharge signal to said X decoder in synchronism with said first clock signal when the numerical values expressed by said plurality of less significant bits becomes "0".

10. A dynamic logic circuit claimed in claim 9 wherein said Y decoder receives and decodes two less significant bits of said internal address and has four decoded lines respectively corresponding to different numerical values "0", "1", "2" and "3" which can be expressed by said two less significant bits, and said latch circuit is connected to a predetermined one of said decoded lines corresponding to the numerical value "0", so that said logic gate circuit supplies said precharge signal to said X decoder in synchronism with said first clock signal when the numerical values expressed by said two less significant bits becomes "0" from "3".

* * * * *